(12) United States Patent
Tanaka et al.

(10) Patent No.: US 12,159,946 B2
(45) Date of Patent: Dec. 3, 2024

(54) PHOTOELECTRIC CONVERSION APPARATUS INCLUDING METAL FILM CONTAINING HYDROGEN AND CARBON

(71) Applicant: CANON KABUSHIKI KAISHA, Tokyo (JP)

(72) Inventors: Yoshiei Tanaka, Tokyo (JP); Takumi Ogino, Tokyo (JP); Tsutomu Tange, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 459 days.

(21) Appl. No.: 17/575,504

(22) Filed: Jan. 13, 2022

(65) Prior Publication Data
US 2022/0231175 A1  Jul. 21, 2022

(30) Foreign Application Priority Data
Jan. 20, 2021 (JP) ................. 2021-007474

(51) Int. Cl.
*H01L 31/02* (2006.01)
*H01L 27/146* (2006.01)

(52) U.S. Cl.
CPC .... *H01L 31/02005* (2013.01); *H01L 27/1462* (2013.01); *H01L 27/14636* (2013.01)

(58) Field of Classification Search
CPC ........... H01L 27/1462; H01L 27/14636; H01L 31/0216
See application file for complete search history.

(56) References Cited

U.S. PATENT DOCUMENTS

| | | | |
|---|---|---|---|
| 2015/0001657 A1* | 1/2015 | Miyazaki | H01L 31/1804 257/431 |
| 2015/0075605 A1 | 3/2015 | Miyamoto et al. | |
| 2019/0371836 A1* | 12/2019 | Ogino | H01L 27/1462 |
| 2021/0167109 A1* | 6/2021 | Ishino | H01L 27/14685 |
| 2022/0373717 A1* | 11/2022 | Abe | G02B 5/3041 |
| 2023/0269949 A1* | 8/2023 | Yamazaki | H01L 29/6675 257/295 |

FOREIGN PATENT DOCUMENTS

| | | |
|---|---|---|
| JP | 2004363580 A | 12/2004 |
| JP | 2016062998 A | 4/2016 |
| WO | 2013115275 A1 | 8/2013 |

\* cited by examiner

*Primary Examiner* — Herve-Louis Y Assouman
*Assistant Examiner* — Christopher M Roland
(74) *Attorney, Agent, or Firm* — Canon U.S.A., Inc. I.P. Division (57) ABSTRACT

A photoelectric conversion apparatus comprises a semiconductor layer including a plurality of photoelectric conversion portions and having a first surface and a second surface that is the surface opposite to the first surface, a wiring structure disposed on the second surface side of the semiconductor layer, and a metal compound film disposed on the first surface side of the semiconductor layer. The metal compound film contains hydrogen and carbon. The concentration of the hydrogen in the interface on the semiconductor layer side of the metal compound film is $1\times10^{21}$ atoms/cm$^3$ or more and $1\times10^{22}$ atoms/cm$^3$ or less. The concentration of the carbon in the interface on the semiconductor layer side of the metal compound film is $5\times10^{20}$ atoms/cm$^3$ or more and $1\times10^{22}$ atoms/cm$^3$ or less.

20 Claims, 6 Drawing Sheets

PHOTOELECTRIC CONVERSION APPARATUS INCLUDING METAL FILM CONTAINING HYDROGEN AND CARBON

BACKGROUND OF THE INVENTION

Field of the Invention

The present disclosure relates to a photoelectric conversion apparatus and equipment.

Description of the Related Art

Photoelectric conversion elements in which a protective film made of aluminum oxide is provided on a silicon substrate having a photoelectric conversion layer have been proposed. International Publication No. WO 2013/115275 (PTL 1) describes that dangling bonds present near the interface of a silicon substrate are likely to be terminated by adding hydrogen to the protective film on the silicon substrate to suppress the recombination of the carrier in the interface of the silicon substrate.

PTL 1 describes that the concentration of hydrogen included in the protective film made of aluminum oxide provided on the silicon substrate is adjusted. However, the dark current cannot be sufficiently suppressed only by adjusting the hydrogen concentration.

SUMMARY OF THE INVENTION

Accordingly, the present disclosure provides a photoelectric conversion apparatus in which the dark current is suppressed in view of the above-mentioned disadvantages.

The present disclosure relates to a photoelectric conversion apparatus comprising a semiconductor layer including a plurality of photoelectric conversion portions and having a first surface and a second surface that is the surface opposite to the first surface, a wiring structure disposed on the second surface side of the semiconductor layer, and a metal compound film disposed on the first surface side of the semiconductor layer. The metal compound film contains hydrogen and carbon. The concentration of the hydrogen in the interface on the semiconductor layer side of the metal compound film is $1\times10^{21}$ atoms/cm$^3$ or more and $1\times10^{22}$ atoms/cm$^3$ or less. The concentration of the carbon in the interface on the semiconductor layer side of the metal compound film is $5\times10^{20}$ atoms/cm$^3$ or more and $1\times10^{22}$ atoms/cm$^3$ or less.

Further features of the present disclosure will become apparent from the following description of exemplary embodiments with reference to the attached drawings.

DESCRIPTION OF THE EMBODIMENTS

Embodiments for implementing the present disclosure will now be described with reference to the drawings. In the following description and drawings, common reference numerals are given to common configurations across multiple drawings.

Accordingly, common configurations will be described with reference to each other of the plurality of drawings, and the description of the configuration with a common reference numeral will be appropriately omitted. Configurations with similar names but different reference numerals may be distinguished by attaching numerals, such as first configuration, second configuration, and third configuration, as appropriate. In the present specification, the description of "xx or more and yy or less" and "xx to yy" indicating the numerical range means the numerical range including the lower limit and the upper limit which are the end points, unless otherwise specified.

Configuration of Photoelectric Conversion Apparatus

Figure 1:
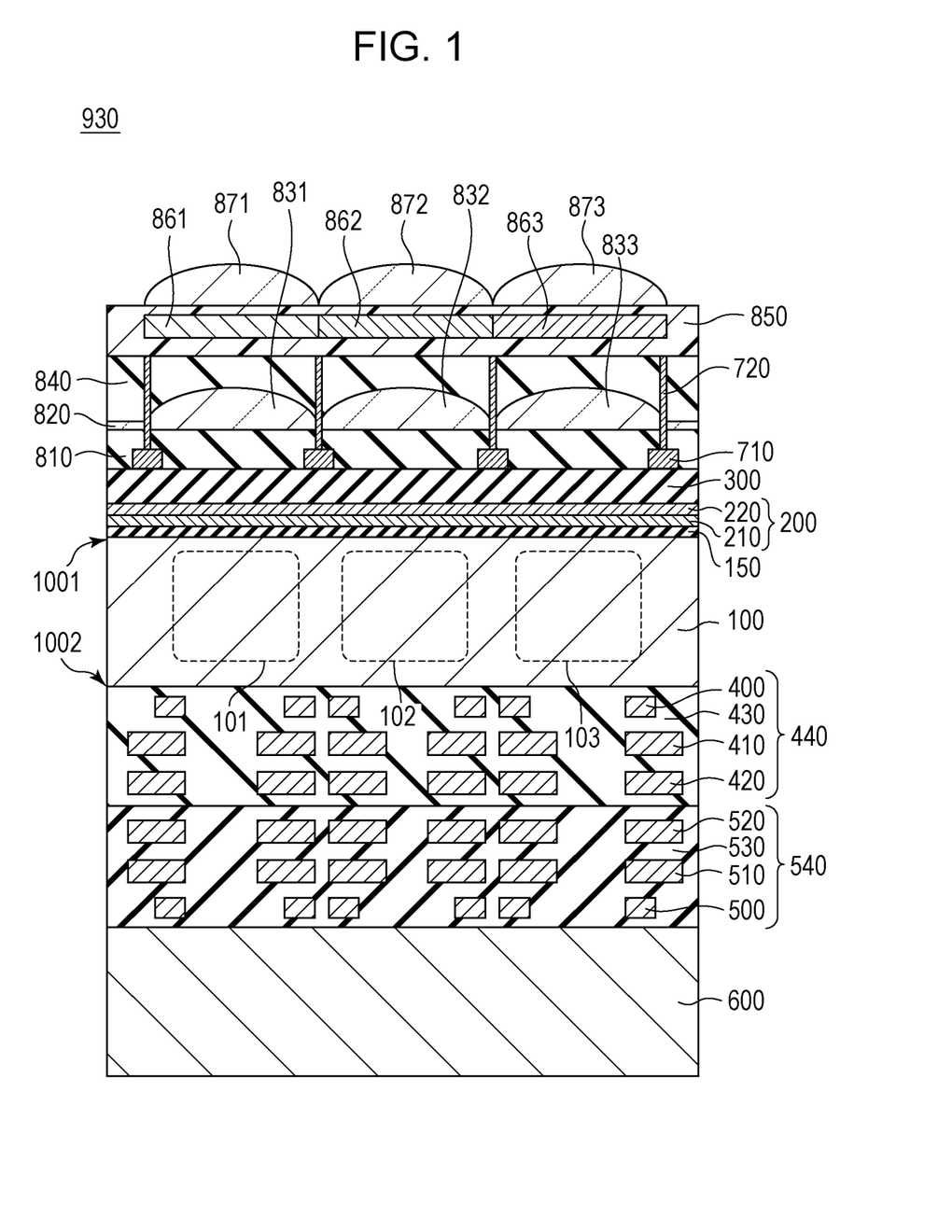
FIG. 1 is a schematic cross-sectional view for explaining a photoelectric conversion apparatus.

FIG. 1 is a cross-sectional view of a photoelectric conversion area (imaging area) of a photoelectric conversion apparatus 930 according to the present embodiment. The photoelectric conversion apparatus 930 includes a semiconductor layer 100 having a plurality of photoelectric conversion portions 101, 102, and 103.

The semiconductor layer 100 is a single-crystal silicon layer having a thickness of, for example, 1 to 10 μm or 2 to 5 μm. The semiconductor layer 100 has a rear surface 1001 constituting a light-receiving surface (light incidence surface) of each of the photoelectric conversion portions 101, 102, and 103. The photoelectric conversion portions 101, 102, and 103 can each be a photodiode.

The rear surface 1001 is one of the two main surfaces of the semiconductor layer 100, and the semiconductor layer 100 has a front surface 1002 that is the other of the two main surfaces of the semiconductor layer 100. Hereinafter, the rear surface 1001 and the front surface 1002 may be referred to as a first surface and a second surface, respectively. The front surface 1002 is provided with a transistor including a gate electrode 400, and a wiring structure 440 constituted of a plurality of wiring layers 410 and 420 and an interlayer insulation film 430 is provided on the front surface 1002. That is, the wiring structure 440 is provided on the second surface side of the semiconductor layer 100. The transistor including the gate electrode 400 includes, for example, a transfer transistor, an amplification transistor, a reset transistor, and a selection transistor, and these transistors constitute a pixel circuit.

On the light-receiving surface of the photoelectric conversion portions 101, 102, and 103, a silicon compound film 300, which is a film of a compound of silicon and at least one of oxygen, nitrogen, and carbon, such as a silicon oxide film, a silicon nitride film, or a silicon carbide film, is provided. The composition of the silicon compound film 300 can be represented by $SiO_xN_yC_z$. Here, any of x, y, and z is larger than 0, and those other than that larger than 0 in x, y, and z may be 0 or not be 0. The silicon compound film can include, for example, hydrogen (H), boron (B), fluorine (F), phosphorus (P), chlorine (Cl), and argon (Ar), in addition to silicon (Si), oxygen (O), nitrogen (N), and carbon (C). When $x>0$, $x \geq y \geq 0$, and $x \geq z \geq 0$, the silicon compound film 300 is a silicon oxide film. When $y>0$, $y \geq x \geq 0$, and $y \geq z \geq 0$, the silicon compound film 300 is a silicon nitride film. When $z>0$, $z \geq x \geq 0$, and $z \geq y \geq 0$, the silicon compound film 300 is a silicon carbide film. For example, an SiON film can be classified into a silicon oxide film or a silicon nitride film depending on the amounts of O and N.

Furthermore, an insulation layer 150 and a metal compound film 200 are stacked on the light-receiving surface of the photoelectric conversion portions 101, 102, and 103 in this order from the light-receiving surface side. In other words, the insulation layer 150 and the metal compound film 200 are disposed on the first surface side of the semiconductor layer 100. In the present embodiment, the insulation layer 150 and the metal compound film 200 are disposed between the silicon compound film 300 and the semiconductor layer 100. The detail of the metal compound film 200 will be described later. In the present embodiment, the insulation layer 150 is disposed between the semiconductor layer 100 and the metal compound film 200 but is not limited thereto. The insulation layer 150 need not be disposed, and the metal compound film 200 may be disposed directly on the semiconductor layer 100. That is, the metal compound film 200 may be disposed on the semiconductor layer 100 so as to be in contact with the semiconductor layer 100.

The insulation layer 150 is disposed on the first surface side of the photoelectric conversion portions 101, 102, and 103. The insulation layer 150 may have s function of reducing the interface state and accordingly can also be called a layer of reducing the interface state. The insulation layer 150 may be formed by oxidizing the rear surface 1001 of the semiconductor layer 100 and is constituted of silicon oxide ($SiO_2$) in the present embodiment. Incidentally, as described later, the metal compound film 200 can be formed by an atomic layer deposition (ALD) method. The insulation layer 150 can also be secondarily formed in the rear surface 1001 of the semiconductor layer 100 when the metal compound film 200 is formed by the ALD method. The thickness of the insulation layer 150 is not particularly limited and may be 1 atomic layer or more and 50 nm or less, 0.1 nm or more and 10 nm or less, 0.2 nm or more and 5 nm or less, or 0.3 nm or more and 2 nm or less. When the thickness of the insulation layer 150 is 10 nm or less or 1 nm or less, hydrogen possessed by the metal compound film 200 is likely to transmit. Consequently, even if the insulation layer 150 is formed between the semiconductor layer 100 and the metal compound film 200, the action of terminating the dangling bonds in the interface of the semiconductor layer 100 by hydrogen possessed by the metal compound film 200 is unlikely to be decreased.

A microlens array including a plurality of microlenses 871, 872, and 873 is provided on the rear surface 1001. One microlens 871 among the microlenses 871, 872, and 873 is disposed above the photoelectric conversion portion 101. One microlens 872 among the microlenses 871, 872, and 873 is disposed above the conversion portion 102. One microlens 873 among the microlenses 871, 872, and 873 is disposed above the photoelectric conversion portion 103. It can also be said that in a planar view from a direction perpendicular to the rear surface 1001, the microlens 871 overlaps the photoelectric conversion portion 101, the microlens 872 overlaps the photoelectric conversion portion 102, and the microlens 873 overlaps the photoelectric conversion portion 103. Each of the microlenses 871, 872, and 873 is made of, for example, a resin.

Another interlayer lens array including a plurality of interlayer lenses 831, 832, and 833 is provided between the microlens array including the plurality of microlenses 871, 872, and 873 and the semiconductor layer 100. The interlayer lenses 831, 832, and 833 are each provided in, for example, a dielectric film 820 such as a silicon nitride film. The interlayer lenses 831, 832, and 833 in this example are upper convex lenses but may be lower convex lenses or biconvex lenses.

An insulating material film 810, such as a silicon oxide film, is provided between the interlayer lenses 831, 832, and 833 and the silicon compound film 300. An insulating material film 840, such as a silicon oxide film, is provided between the interlayer lenses 831, 832, and 833 and the microlenses 871, 872, and 873. Light collection by the interlayer lenses 831, 832, and 833 is performed due to the difference in refractive index between the insulating material film 840 and the interlayer lenses 831, 832, and 833 made of silicon nitride. A color filter array including color filters 861, 862, and 863 is provided between the interlayer lenses 831, 832, and 833 and the microlenses 871, 872, and 873. It can also be said that in a planar view from a direction perpendicular to the rear surface 1001, the color filter 861 overlaps the photoelectric conversion portion 101, the color filter 862 overlaps the photoelectric conversion portion 102, and the color filter 863 overlaps the photoelectric conversion portion 103. For example, the color filter 861 is a red filter, the color filter 862 is a green filter, and the color filter 863 is a blue filter. A planarizing film 850 is provided between the color filters 861, 862, and 863 and the interlayer lenses 831, 832, and 833 and/or between the color filters 861, 862, and 863 and the microlenses 871, 872, and 873. The planarizing film 850 is made of, for example, a resin.

A light-shielding member 710 is provided between the insulating material film 810, such as a silicon oxide film, and a silicon compound film 300. A light-shielding wall 720 is provided on the light-shielding member 710. The light-shielding wall 720 can be provided so as to penetrate at least one of the insulating material film 810, the dielectric film 820, and the insulating material film 840. The light-shielding wall 720 can be disposed so as to surround the interlayer lenses 831, 832, and 833.

The optical structure of one pixel is defined mainly by a microlens, a color filter, an interlayer lens, and a photoelectric conversion portion. For example, the optical structure of a pixel including the photoelectric conversion portion 102 is defined by the microlens 872, the color filter 862, the interlayer lens 832, and the photoelectric conversion portion 102. However, some of the microlens, the color filter, and the interlayer lens can be omitted.

A semiconductor substrate 600 is stacked to the semiconductor layer 100. A transistor including a gate electrode 500 is disposed on a surface of the semiconductor substrate 600. On the surface of the semiconductor substrate 600 (between the semiconductor substrate 600 and the wiring structure 440), a wiring structure 540 is provided. The wiring structure 540 is constituted of a plurality of wiring layers 510 and 520 and an interlayer insulation film 530. The transistor including the gate electrode 500 constitutes a driving circuit for driving a pixel circuit including a photoelectric conversion portion or a control circuit for controlling the photoelectric conversion apparatus 930. The transistor including the gate electrode 500 constitutes an AD conversion circuit for performing analog-to-digital (AD) conversion of the analog signal obtained from the pixel circuit. The transistor including the gate electrode 500 constitutes a digital signal processing circuit for processing the digital signal obtained by the AD conversion. The electrical connection between the wiring structure 440 and the wiring structure 540 is accomplished by wiring through direct bonding of a wiring layer or a through-via passing through the semiconductor layer 100. The electrical connection between the wiring structure 440 and the wiring structure 540 may be accomplished by a bump between the wiring structure 440 and the wiring structure 540 or by wire bonding. When the semiconductor substrate 600 is used as a mere supporting substrate, the transistor including the gate electrode 500 and the wiring structure 540 can be omitted.

Metal Compound Layer

The metal compound film 200 is a monolayer film of a metal compound layer or a multilayer film of metal compound layers. The metal compound layer constituting the metal compound film 200 is any of a metal oxide layer, a metal nitride layer, and a metal carbide layer. In particular, the metal compound layer may be a metal oxide layer from the viewpoint of the high light transmittance. As a specific material constituting the metal compound layer, for example, an oxide, a nitride, or a carbide including at least one element selected from hafnium (Hf), aluminum (Al), zirconium (Zr), tantalum (Ta), and titanium (Ti) can be used. The material constituting the metal compound layer may be a compound represented by $MO_lN_mC_n$. Here, any of l, m, and n is larger than 0, and those other than that larger than 0 in l, m, and n may be 0 or not be 0. In particular, l can be larger than 0. M may be any of hafnium (Hf), aluminum (Al), zirconium (Zr), tantalum (Ta), and titanium (Ti). Examples of the material constituting the metal compound layer include, in addition to the above, an oxide, a nitride, or a carbide including at least one element selected from lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), and yttrium (Y). The metal compound layer may include at least one layer selected from a hafnium oxide layer, a zirconium oxide layer, an aluminum oxide layer, a titanium oxide layer, and a tantalum oxide layer.

The metal compound film 200 may include a layer having a negative fixed electric charge. In other words, the metal compound film 200 may be a fixed electric charge film having a negative fixed electric charge. When the metal compound film 200 is composed of a plurality of metal compound layers, among the plurality of metal compound layers, the metal compound layer nearest the semiconductor layer 100 may be the layer having a negative fixed electric charge. When the metal compound film 200 has a negative fixed electric charge, an inversion layer is formed on the rear surface 1001 side (the side of the surface in contact with the metal compound film 200) of the semiconductor layer 100. Consequently, the interface of the semiconductor layer 100 is pinned by the inversion layer, and occurrence of a dark current is therefore suppressed.

The metal oxide layer can have a fixed electric charge when the composition of the metal and oxygen in the metal oxide layer deviates from the stoichiometric ratio. When the composition is low in the metal or high in oxygen relative to the stoichiometric ratio, the metal oxide layer can have a negative fixed electric charge. For example, when aluminum oxide is used as the metal oxide layer nearest the semiconductor layer 100 among the layers constituting the metal compound film 200, the composition may be low in aluminum or high in oxygen relative to the stoichiometric ratio.

The metal compound film 200 of this example is a laminated film including a first metal compound layer 210 and a second metal compound layer 220 from the side near the semiconductor layer 100. The thickness of the metal compound film 200 is the sum of the thickness of the first metal compound layer 210 and the thickness of the second metal compound layer 220. The thickness of the first metal compound layer 210 may be smaller than the thickness of the second metal compound layer 220.

The first metal compound layer 210 may has a negative fixed electric charge as described above and can function as a charge fixing layer for fixing the non-signal charge of the semiconductor layer 100. The second metal compound layer 220 can function as an antireflection layer for light incident on the semiconductor layer 100. The first metal compound layer 210 is the layer nearest the semiconductor layer 100 among the plurality of layers constituting the metal compound film 200. The first metal compound layer 210 may be any of a hafnium oxide layer, a zirconium oxide layer, an aluminum oxide layer, a titanium oxide layer, and a tantalum oxide layer or may be an aluminum oxide layer. The second metal compound layer 220 may be any of a hafnium oxide layer, a zirconium oxide layer, an aluminum oxide layer, a titanium oxide layer, and a tantalum oxide layer or may be a hafnium oxide layer or a tantalum oxide layer.

When the semiconductor layer 100 is a silicon layer and performs photoelectric conversion of visible light, the metal compound film 200 may have the following configuration: the first metal compound layer 210 is, for example, an aluminum oxide ($Al_2O_3$) layer having a thickness of 5 to 20 nm, and the second metal compound layer 220 is, for example, a tantalum oxide ($Ta_2O_5$) layer having a thickness of 25 to 100 nm. Furthermore, an insulation layer 150 is disposed between the semiconductor layer 100 and the first metal compound layer 210, and the insulation layer 150 can be, for example, a silicon oxide ($SiO_2$) layer having a thickness of 0.1 to 5 nm.

In the present embodiment, a rear-surface-irradiation-type photoelectric conversion apparatus in which the rear surface 1001 forms a light-receiving surface has been described, but the present disclosure can also be applied to a front-surface-irradiation-type photoelectric conversion apparatus in which the front surface 1002 forms a light-receiving surface. In addition, in the present embodiment, a complementary metal oxide semiconductor (CMOS) image sensor has been described as the photoelectric conversion apparatus, but the present invention is not limited thereto. The photoelectric conversion apparatus can be applied to an arbitrary sensor, such as a charge coupled device (CCD) image sensor.

Hydrogen Concentration and Carbon Concentration in Metal Compound Layer

The metal compound film 200 contains hydrogen and carbon. In the present embodiment, the first metal compound layer 210 includes hydrogen and carbon. In addition, in the present embodiment, the first metal compound layer 210 is constituted of aluminum oxide and has a negative fixed electric charge.

Hydrogen Concentration

The dangling bonds of the material constituting the semiconductor layer 100, the dangling bonds being capable of being present in the interface of the rear surface 1001 of the semiconductor layer 100, are terminated by that the first metal compound layer 210 includes hydrogen. The termination of dangling bonds suppresses the recombination of the carrier in the rear surface 1001 of the semiconductor layer 100, resulting in suppression of dark current. Incidentally, even if another layer, such as the insulation layer 150, lies between the first metal compound layer 210 and the semiconductor layer 100, when the another layer is a sufficiently thin layer, hydrogen passes through the another layer to terminate dangling bonds.

Accordingly, from the viewpoint of suppressing the dark current by termination of the dangling bonds of the interface of the rear surface 1001 of the semiconductor layer 100, the concentration of hydrogen included in the first metal compound layer 210 may be high to some extent. In particular, among the interfaces of the first metal compound layer 210, hydrogen present in the interface near the semiconductor layer 100 (i.e., the interface on the semiconductor layer side) highly contributes to the termination of dangling bonds, and thereby the hydrogen concentration in the interface near the semiconductor layer 100 may be high. Specifically, the hydrogen concentration in the interface on the semiconductor layer 100 side of the first metal compound layer 210 may be $1\times10^{21}$ atoms/cm$^3$ or more.

In contrast, if hydrogen is excessively included in the first metal compound layer 210, a large amount of free hydrogen that does not contribute to termination of dangling bonds of the semiconductor layer 100 and also does not bond to the metal compound constituting the first metal compound layer 210 can be present. It is inferred that such hydrogen is present as hydrogen ions (H$^f$) in the first metal compound layer 210. If a large amount of hydrogen ions are present in the first metal compound layer 210, the negative fixed electric charge of the first metal compound layer 210 is decreased, and the effect of suppressing the dark current can be decreased. Consequently, the concentration of hydrogen included in the first metal compound layer 210 may be low to some extent. In particular, if hydrogen ions are present in the interface near the semiconductor layer 100 among the interfaces of the first metal compound layer 210, since a decrease in the negative fixed electric charge is likely to occur, the hydrogen concentration in the interface near the semiconductor layer 100 may be low. Specifically, the hydrogen concentration in the interface on the semiconductor layer 100 side of the first metal compound layer 210 may be $1\times10^{22}$ atoms/cm$^3$ or less. In addition, the hydrogen concentration in the interface on the semiconductor layer 100 side of the first metal compound layer 210 may be $5\times10^{21}$ atoms/cm$^3$ or less and may be less than $3\times10^{21}$ atoms/cm$^3$.

When the above is put together, the hydrogen concentration in the interface on the semiconductor layer 100 side of the first metal compound layer 210 may be $1\times10^{21}$ atoms/cm$^3$ or more and $1\times10^{22}$ atoms/cm$^3$ or less. In addition, the hydrogen concentration may be $1\times10^{21}$ atoms/cm$^3$ or more and $5\times10^{21}$ atoms/cm$^3$ or less and further preferably $1\times10^{21}$ atoms/cm$^3$ or more and less than $3\times10^{21}$ atoms/cm$^3$. When the hydrogen concentration is within the above-mentioned range, the dark current can be suppressed.

The hydrogen concentration in the interface on the semiconductor layer 100 side of the first metal compound layer 210 may be the hydrogen concentration in a height region from 0 to 3 nm with the interface on the semiconductor layer 100 side of the first metal compound layer 210 as the reference height (0 nm). Here, the direction from the semiconductor layer 100 toward the first metal compound layer 210 is defined as the forward direction.

In the first metal compound layer 210, the hydrogen concentration distribution in the layer thickness direction may be heterogeneous. In other words, in the first metal compound layer 210, the hydrogen concentration may vary along the layer thickness direction. That is, the hydrogen concentration in the interface on the semiconductor layer 100 side of the first metal compound layer 210 and the hydrogen concentration in a portion away from the interface on the semiconductor layer 100 side of the first metal compound layer 210 may be different from each other. In the following description, the former hydrogen concentration is referred to as interfacial hydrogen concentration, and the latter hydrogen concentration is referred to as hydrogen concentration in film. The hydrogen concentration in film may be the hydrogen concentration in the region 3 nm or more away from the interface on the semiconductor layer 100 side of the first metal compound layer 210.

The hydrogen concentration in film may be lower than the interfacial hydrogen concentration. When the hydrogen concentration is low, the crystallinity of the first metal compound layer 210 can be enhanced. Consequently, the mechanical intensity is increased, and also the moisture resistance can be improved. The hydrogen concentration in the first metal compound layer 210 may monotonically decrease with an increase in the distance from the interface on the semiconductor layer 100 side in the region between the interface on the semiconductor layer 100 side and a plane 3 nm away from the interface on the side opposite to the semiconductor layer 100. In such a case, both suppression of dark current by termination of dangling bonds in the interface of the semiconductor layer 100 and high moisture resistance and high mechanical intensity of the first metal compound layer 210 can be achieved. The hydrogen concentration in film of the first metal compound layer 210 may be $5\times10^{20}$ atoms/cm$^3$ or more and $2\times10^{21}$ atoms/cm$^3$ or less. Incidentally, the concentrations of hydrogen and carbon of the metal compound film 200 such as the first metal compound layer 210 can be adjusted by film formation atmosphere, film formation temperature, and heat treatment conditions after film formation.

Figure 2A:
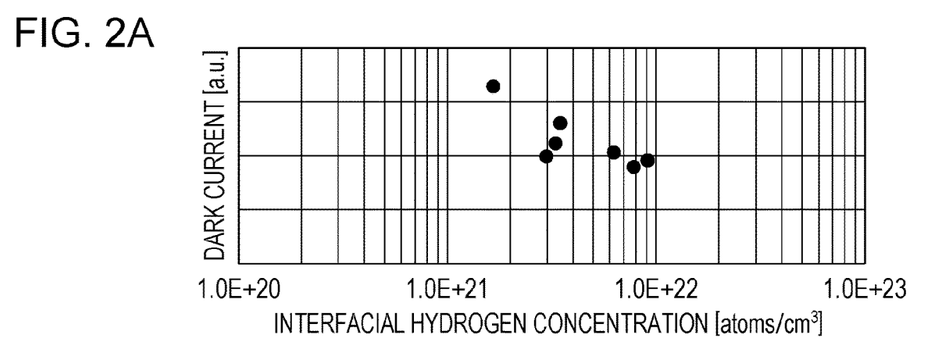
FIGS. 2A to 2D are graphs of relationships between hydrogen concentration or carbon concentration and dark current for explaining a photoelectric conversion apparatus.
Figure 2B:
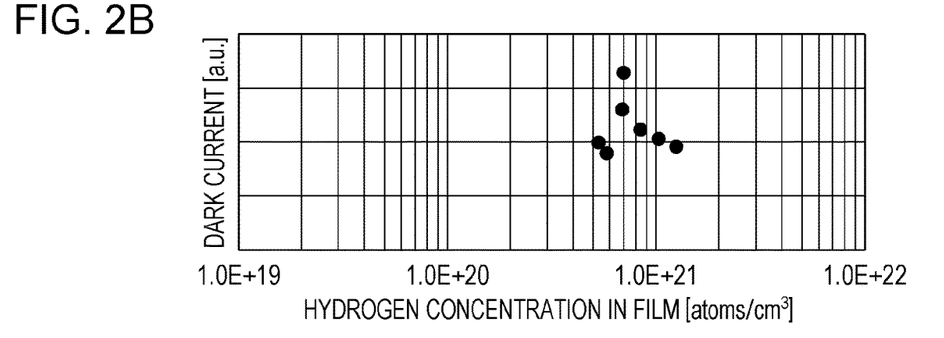

FIGS. 2A to 2D are graphs showing relationships between the hydrogen concentration and the average value of dark current and relationships between the carbon concentration and the average value of dark current in the first metal compound layer 210, when the semiconductor layer 100 is constituted of silicon and the first metal compound layer 210 is constituted of aluminum oxide. FIG. 2A shows a relationship between interfacial hydrogen concentration and the average value of dark current, FIG. 2B shows a relationship between hydrogen concentration in film and the average value of dark current. As shown in FIG. 2A, the dark current tends to be suppressed with an increase in the interfacial hydrogen concentration. When the interfacial hydrogen concentration is $1\times10^{21}$ atoms/cm$^3$ or more and $1\times10^{22}$ atoms/cm$^3$ or less, the value of dark current is low. As shown in FIG. 2B, also in the hydrogen concentration in film, the dark current tends to be suppressed with an increase in the hydrogen concentration in film, and when the hydrogen concentration in film is $5\times10^{20}$ atoms/cm$^3$ or more and $2\times10^{21}$ atoms/cm$^3$ or less, the value of dark current is low. Here, although the case in which the semiconductor layer 100 is constituted of silicon and the first metal compound layer 210 is constituted of aluminum oxide has been considered, the above is the same also when the semiconductor layer 100 and the first metal compound layer 210 are constituted of other materials.

Carbon Concentration

As described above, if hydrogen is excessively contained in the first metal compound layer 210, a large amount of free hydrogen can be present in the first metal compound layer 210. Such free hydrogen can reduce the dark current-suppressing effect. Accordingly, in the present embodiment, carbon is added to the first metal compound layer 210. The carbon included in the first metal compound layer 210 can be present in bonding with a metal element represented by M, as represented by, for example, M-$CH_2$— or M-C—O—. The first metal compound layer 210 can be formed by a film formation method using an organic metal as a raw material, such as an ALD method and a metal organic chemical vapor deposition (MOCVD) method, as described later. Particularly, when the layer is formed by such a film formation method, carbon is likely to present in bonding with the metal element in the above-mentioned form. When the first metal compound layer 210 contains a certainly large amount of carbon, even if a large amount of hydrogen is contained and a large amount of hydrogen that does not contribute to termination of dangling bonds in the interface of the semiconductor layer 100 is present, such hydrogen is captured by carbon. Consequently, it is possible to suppress the negative fixed electric charge from being decreased by liberation of hydrogen in the first metal compound layer 210.

When the first metal compound layer 210 includes carbon, the refractive index of the first metal compound layer 210 is reduced. The carbon concentration of the first metal compound layer 210 and the refractive index of the first metal compound layer 210 are in reverse proportion to each other, and the higher the carbon concentration of the first metal compound layer 210, the lower the refractive index of the first metal compound layer 210. Generally, the semiconductor layer 100 has a high refractive index, and the refractive index of the semiconductor layer 100 is higher than the refractive index of the first metal compound layer 210. If the refractive index of the first metal compound layer 210 is too low, the difference of the refractive indices of the first metal compound layer 210 and the semiconductor layer 100 becomes large, and the reflectance between the first metal compound layer 210 and the semiconductor layer 100 becomes large. Accordingly, from the viewpoint of the efficiency of light incident on the semiconductor layer 100, the refractive index of the first metal compound layer 210 need not be very low, and the carbon concentration of the first metal compound layer 210 may be accordingly low to some extent. Incidentally, even if an insulation layer 150 is disposed between the semiconductor layer 100 and the first metal compound layer 210, when the thickness of the insulation layer 150 is sufficiently small, the influence of the insulation layer 150 on the reflection of light between the semiconductor layer 100 and the first metal compound layer 210 can be ignored. For example, when the thickness of the insulation layer 150 is 50 nm or less, the reflection of light between the semiconductor layer 100 and the first metal compound layer 210 can be dominated by the refractive index of the semiconductor layer 100 and the refractive index of the first metal compound layer 210.

Based on the above, the carbon concentration in the interface on the semiconductor layer 100 side of the first metal compound layer 210 may be $5 \times 10^{20}$ atoms/$cm^3$ or more and $1 \times 10^{22}$ atoms/$cm^3$ or less. In addition, the carbon concentration in the interface on the semiconductor layer 100 side of the first metal compound layer 210 may be $1 \times 10^{21}$ atoms/$cm^3$ or more or $2 \times 10^{21}$ atoms/$cm^3$ or more. When the carbon concentration in the interface on the semiconductor layer 100 side of the first metal compound layer 210 is $5 \times 10^{20}$ atoms/$cm^3$ or more, liberation of hydrogen can be suppressed, and the dark current-suppressing effect can be enhanced. When the carbon concentration in the interface on the semiconductor layer 100 side of the first metal compound layer 210 is $1 \times 10^{22}$ atoms/$cm^3$ or less, the crystallinity of the first metal compound layer 210 can be suppressed from decreasing. The carbon concentration in the interface on the semiconductor layer 100 side of the first metal compound layer 210 may be the carbon concentration in a height region from 0 to 3 nm with the interface on the semiconductor layer 100 side of the first metal compound layer 210 as the reference height (0 nm), as in the interfacial hydrogen concentration.

In the first metal compound layer 210, the carbon concentration distribution in the layer thickness direction may be heterogeneous. In other words, in the first metal compound layer 210, the carbon concentration may vary along the layer thickness direction. That is, the carbon concentration in the interface on the semiconductor layer 100 side of the first metal compound layer 210 and the carbon concentration in a portion away from the interface on the semiconductor layer 100 side of the first metal compound layer 210 may be different from each other. In the following description, as in the case of hydrogen concentration, the former carbon concentration is referred to as interfacial carbon concentration, and the latter carbon concentration is referred to as carbon concentration in film. The carbon concentration in film may be the carbon concentration in the region 3 nm or more away from the interface on the semiconductor layer 100 side of the first metal compound layer 210.

The carbon concentration in film of the first metal compound layer 210 may be $1 \times 10^{19}$ atoms/$cm^3$ or more and $1 \times 10^{21}$ atoms/$cm^3$ or less.

Figure 2C:
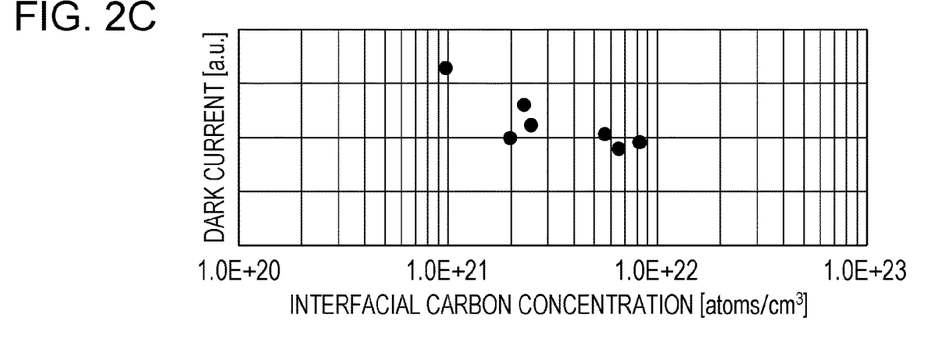
Figure 2D:
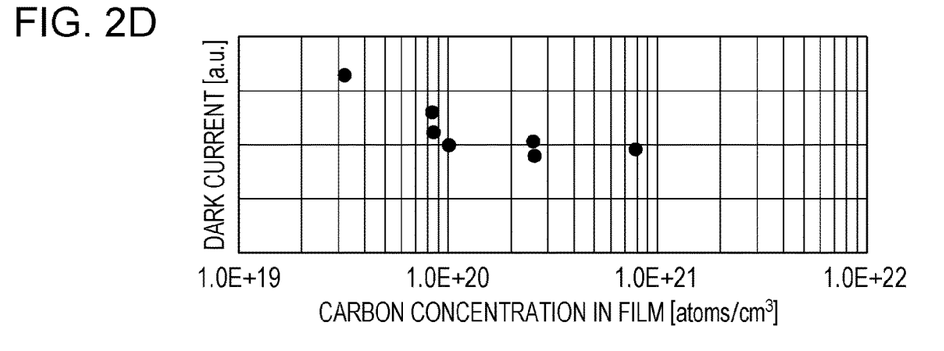

FIG. 2C shows a relationship between interfacial carbon concentration and the average value of dark current, FIG. 2D shows a relationship between carbon concentration in film and the average value of dark current. As shown in FIG. 2C, the dark current tends to be suppressed with an increase in the interfacial carbon concentration. When the interfacial carbon concentration is $5 \times 10^{20}$ atoms/$cm^3$ or more and $1 \times 10^{22}$ atoms/$cm^3$ or less, the value of dark current is low. As shown in FIG. 2D, also in the carbon concentration in film, the dark current tends to be suppressed with an increase in the carbon concentration in film, and when the carbon concentration in film is $1 \times 10^{19}$ atoms/$cm^3$ or more and $1 \times 10^{21}$ atoms/$cm^3$ or less, the value of dark current is low. Here, although the case in which the semiconductor layer 100 is constituted of silicon and the first metal compound layer 210 is constituted of aluminum oxide has been considered, the above is the same also when the semiconductor layer 100 and the first metal compound layer 210 are constituted of other materials.

Ratio of Hydrogen Concentration and Carbon Concentration

As described above, since carbon contained in the first metal compound layer 210 has a function of capturing excess hydrogen in the first metal compound layer 210, in the viewpoint of suppressing dark current, the ratio of the carbon concentration and the hydrogen concentration in the first metal compound layer 210 is also important. The reduction in the refractive index of the first metal compound layer 210 can be suppressed by adjusting the ratio of the hydrogen concentration and the carbon concentration in the first metal compound layer 210 to an appropriate value, while suppressing dark current by the hydrogen-capturing effect of carbon. Hereinafter, the ratio of the hydrogen concentration to the carbon concentration in the first metal compound layer 210 (hydrogen concentration/carbon concentration) will be considered.

If the ratio, hydrogen concentration/carbon concentration, is too high, excess hydrogen that does not contribute to the termination of dangling bonds in the interface of the semiconductor layer 100 cannot be captured by carbon, and free hydrogen is likely to be generated in the first metal compound layer 210. As a result, as described above, the negative fixed electric charge possessed by the first metal compound layer 210 is reduced, and the dark current-suppressing effect is reduced. Accordingly, the hydrogen concentration/carbon concentration may be low to some extent. Specifically, the hydrogen concentration/carbon concentration in the interface on the semiconductor layer 100 side of the first metal compound layer 210 may be 1.5 or less. In addition, the hydrogen concentration/carbon concentration in the film of the first metal compound layer 210 may be 10 or less. Consequently, the dark current can be effectively suppressed.

Figure 3A:
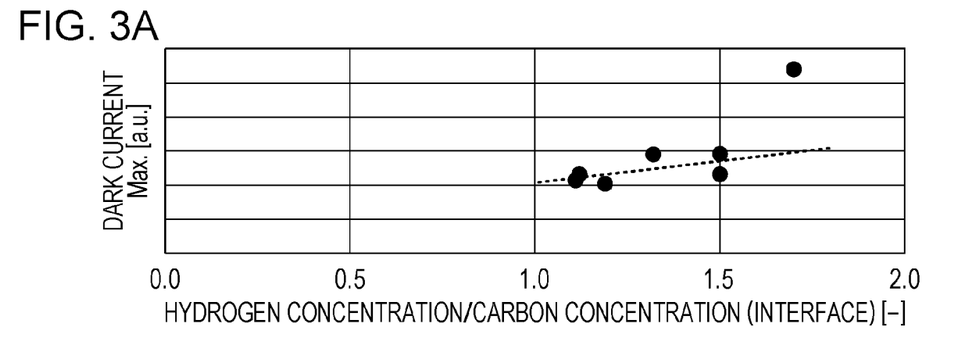
FIGS. 3A to 3D are graphs of relationships between the ratio of hydrogen concentration to carbon concentration and dark current for explaining a photoelectric conversion apparatus.
Figure 3B:
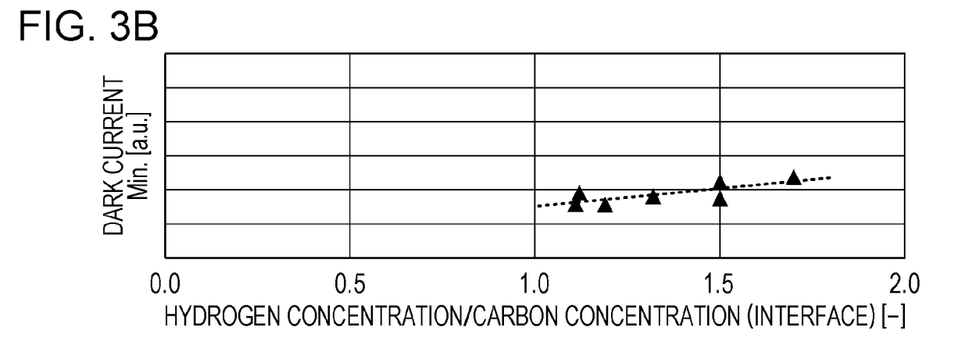
Figure 3C:
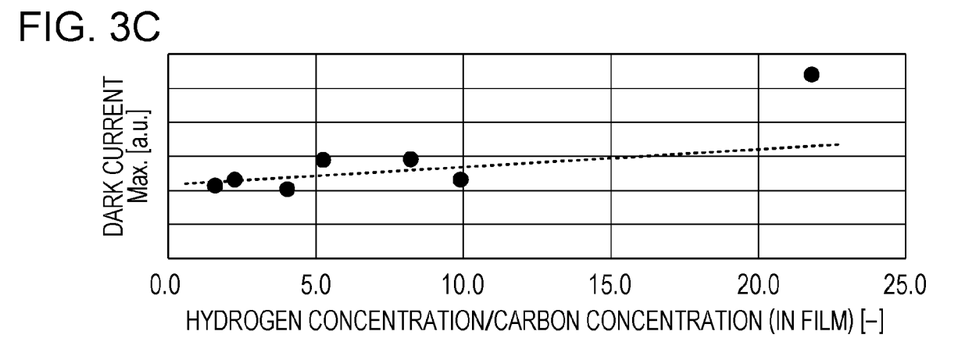
Figure 3D:
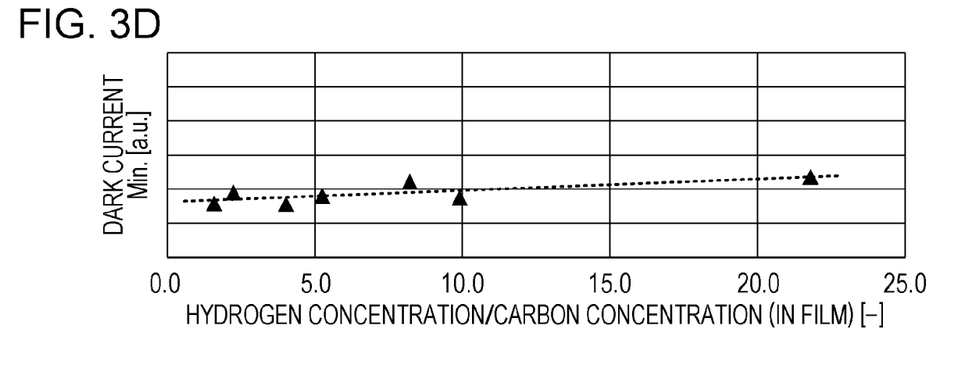

FIGS. 3A to 3D are graphs showing relationships between the ratio of the hydrogen concentration to the carbon concentration (hydrogen concentration/carbon concentration) in the first metal compound layer 210 and the dark current when the semiconductor layer 100 is constituted of silicon and the first metal compound layer 210 is constituted of aluminum oxide. FIG. 3A shows a relationship between the hydrogen concentration/carbon concentration in the interface on the semiconductor layer 100 side of the first metal compound layer 210 and the maximum value of dark current, and FIG. 3B shows a relationship between the hydrogen concentration/carbon concentration in the interface on the semiconductor layer 100 side of the first metal compound layer 210 and the minimum value of dark current. As shown in FIG. 3A, when the hydrogen concentration/carbon concentration in the interface exceeds 1.5, the maximum value of dark current significantly increases, and the dark current can be suppressed by adjusting the hydrogen concentration/carbon concentration to 1.5 or less. FIG. 3C shows a relationship between the hydrogen concentration/carbon concentration in the film of the first metal compound layer 210 and the maximum value of dark current, and FIG. 3D shows a relationship between the hydrogen concentration/carbon concentration in the film of the first metal compound layer 210 and the maximum value of dark current. As shown in FIG. 3C, when the hydrogen concentration/carbon concentration in the film exceeds 20, the maximum value of dark current significantly increases, and the dark current can be suppressed by adjusting the hydrogen concentration/carbon concentration to 10 or less. Here, although the case in which the semiconductor layer 100 is constituted of silicon and the first metal compound layer 210 is constituted of aluminum oxide has been considered, the above is the same also when the semiconductor layer 100 and the first metal compound layer 210 are constituted of other materials.

Other Embodiments

Figure 4:
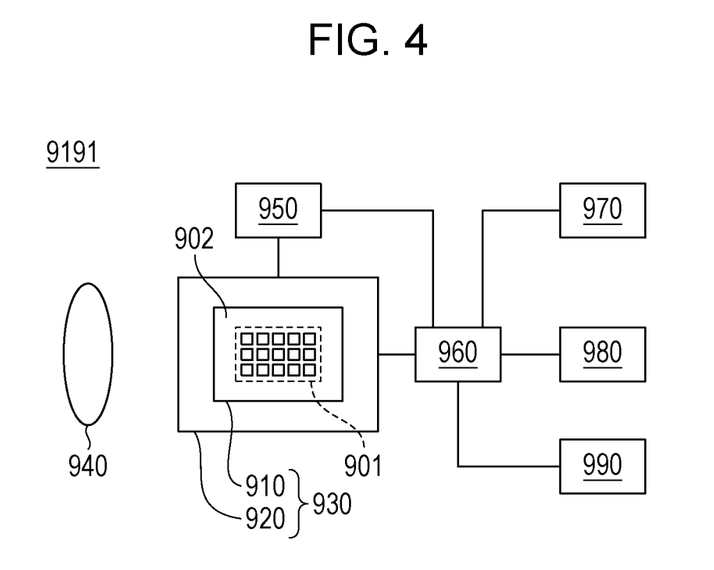
FIG. 4 is a schematic view for explaining equipment including a photoelectric conversion apparatus.

FIG. 4 is a schematic view of equipment 9191 including a photoelectric conversion apparatus 930. The equipment 9191 further includes at least one of an optical system 940, a controller 950, a processor 960, a memory 970, a display 980, and a mechanical device 990, in addition to the photoelectric conversion apparatus 930. The optical system 940 is associated with the photoelectric conversion apparatus 930 and forms an image in the photoelectric conversion apparatus. The controller 950 controls the photoelectric conversion apparatus 930. The processor 960 processes the signal output from the photoelectric conversion apparatus 930. The memory 970 stores the information obtained by the photoelectric conversion apparatus 930. The display 980 displays the information obtained by the photoelectric conversion apparatus 930. The mechanical device 990 is operated based on the information obtained by the photoelectric conversion apparatus 930. The mechanical device 990 may be a moving device for moving the photoelectric conversion apparatus 930 in the equipment 9191 or moving the whole equipment 9191. An anti-vibration (image stabilizer) function can be realized by moving the photoelectric conversion apparatus 930 in the equipment 9191.

The photoelectric conversion apparatus 930 may include an electric device 910 and a mount member 920, but the mount member 920 need not be present. The electric device 910 is a semiconductor device including a semiconductor layer. The electric device 910 includes a photoelectric conversion area 901 where the photoelectric conversion portion is disposed and a peripheral circuit area 902 where a peripheral circuit (not shown) is disposed. The peripheral circuit includes the above-mentioned driving circuit, AD conversion circuit, digital signal processing circuit, control circuit, and so on. The photoelectric conversion area 901 and the peripheral circuit area 902 may be disposed on a single semiconductor layer, but in this example, they may be arranged on separate semiconductor layers (semiconductor substrates) laminated with each other.

The mount member 920 includes, for example, a ceramic package or a plastic package, a printed wiring board, a flexible cable, solder, and wiring bonding. The optical system 940 is, for example, a lens, a shutter, a filter, and a mirror. The controller 950 is, for example, a semiconductor device, such as an ASIC. The processor 960 is, for example, a semiconductor device, such as a central processing unit (CPU) or an application specific integrated circuit (ASIC), constituting an analog front end (AFE) or a digital front end (DFE). The display 980 is, for example, an EL display or a liquid crystal display. The memory 970 is a volatile memory, such as an SRAM and a DRAM, or a non-volatile memory, such as a flash memory and a hard disk drive, and is, for example, a magnetic device or a semiconductor device. The mechanical device MCHN includes a moving part or a promoting part, such as a motor or an engine.

The equipment 9191 shown in FIG. 4 can be electronic equipment, such as an information terminal having a photographing function (e.g., smart phone and wearable terminal) and a camera (e.g., interchangeable lens camera, compact camera, video camera, and monitoring camera). The mechanical device 990 of a camera can drive a part of the optical system 940 for zooming, focusing, or shutter operation. Furthermore, the equipment 9191 can be transportation equipment (moving body), such as a vehicle, a ship, a flight vehicle, and an artificial satellite.

The mechanical device 990 of transportation equipment can be used as a moving device. The equipment 9191 as transportation equipment is suitable for transporting the photoelectric conversion apparatus 930 or assisting and/or automating driving (maneuvering) by the photographing function. The processor 960 for assisting and/or automating of driving (maneuvering) can perform processing for operating the mechanical device 990 as a moving device based on information obtained by the photoelectric conversion apparatus 930. In addition, the equipment 9191 can be analytical equipment or medical equipment.

The photoelectric conversion apparatus 930 according to the present embodiment can provide a high value to a designer, manufacturer, seller, purchaser, and/or user thereof. Accordingly, the value of the equipment 9191 can also be increased by mounting the photoelectric conversion apparatus 930 on the equipment 9191. Therefore, determination of installation of the photoelectric conversion apparatus 930 of the present embodiment on the equipment 9191 is advantageous for increasing the value of the equipment 9191 in manufacturing and selling the equipment 9191.

Method for Manufacturing Photoelectric Conversion Apparatus

A method for manufacturing the photoelectric conversion apparatus will be described using FIGS. 5A to 5F and 6A to 6D.

Figure 5A:
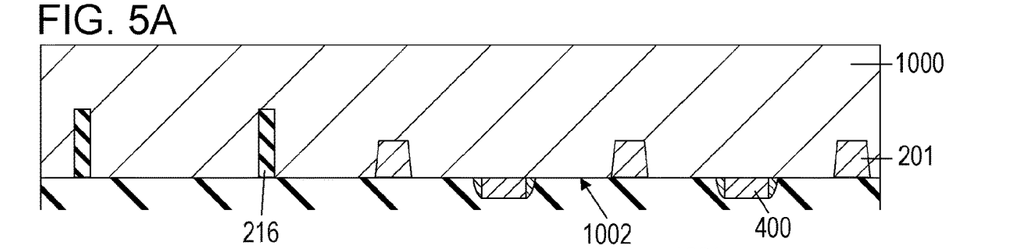
FIG. 5A to 5F are schematic cross-sectional views for explaining a method for manufacturing a photoelectric conversion apparatus.

As shown in FIG. 5A, a semiconductor substrate 1000 in which a transistor including a photoelectric conversion portion and a gate electrode 400 and a wiring structure (not shown) are formed is turned over and is joined with a supporting substrate (not shown). The supporting substrate may be a semiconductor substrate 600. The semiconductor substrate 1000 is provided with an element isolation portion 201 having an STI structure on the front surface 1002 side. In addition, the semiconductor substrate 1000 is provided with an insulating region 216 where a groove having a depth deeper than the element isolation portion 201 is filled with an insulating material on the front surface 1002 side.

Figure 5B:
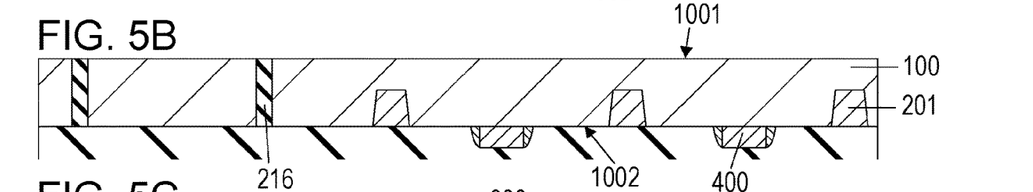

Subsequently, as shown in FIG. 5B, the semiconductor substrate 1000 is thinned from the side opposite to the front surface 1002 until the thickness becomes about several to several tens micrometers which allows the insulating region 216 to pass through the semiconductor substrate 1000 to form a semiconductor layer 100 having a front surface 1002 and a rear surface 1001. The method for thinning is, for example, back grinding, chemical mechanical polishing, or etching.

Figure 5C:
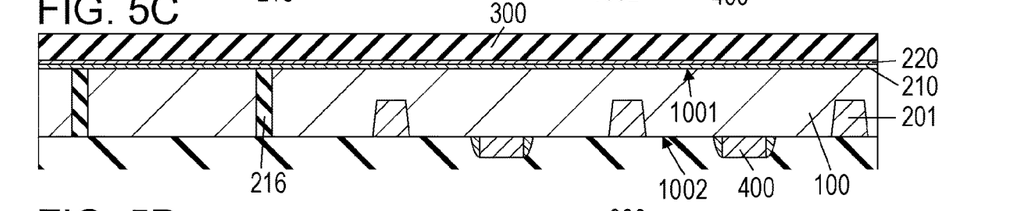

Subsequently, as shown in FIG. 5C, a first metal compound layer 210, a second metal compound layer 220, and a silicon compound film 300 are formed on the rear surface 1001 of the semiconductor layer 100. As the method for forming the first metal compound layer 210, for example, a film formation method using an organic metal gas as a raw material, such as an ALD method or an MOCVD method, can be used. In the present embodiment, the first metal compound layer 210 is an aluminum oxide layer. The hydrogen concentration and the carbon concentration in the aluminum oxide film and in the interface with the semiconductor layer 100 can be adjusted by the conditions for forming the aluminum oxide layer. Incidentally, although it is not shown in FIGS. 5A to 5F and 6A to 6D, an insulation layer 150 with a thickness of about 1 nm is formed between the rear surface 1001 of the semiconductor layer 100 and the first metal compound layer 210. In the present embodiment, the insulation layer 150 is a silicon oxide layer and can be formed by oxidizing the rear surface 1001 of the semiconductor layer 100 made of silicon when the first metal compound layer 210 is formed by an ALD method.

The method for forming the second metal compound layer 220 is, for example, an ALD method, an MOCVD method, a PVD method, or a CVD method. The second metal compound layer 220 is, for example, a tantalum oxide layer or a titanium oxide layer.

The silicon compound film 300 can be arbitrarily selected from materials that are generally used in semiconductor apparatuses, such as a silicon oxide film, a silicon nitride film, a silicon oxynitride film, a carbon-containing silicon oxide film, and a fluorine-containing silicon oxide film. The layer structure of the silicon compound film 300 may be a single layer structure made of one material or a laminated layer structure made of a plurality of materials.

Figure 5D:
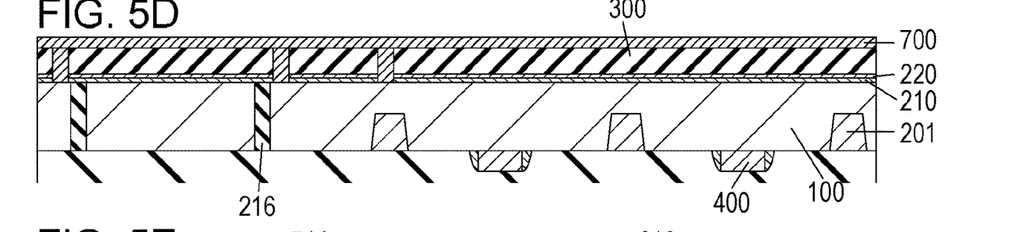

Subsequently, a groove for embedding a metal structure is formed in the silicon compound film 300. Subsequently, as shown in FIG. 5D, a conductor film 700 is formed over the entire surface of the silicon compound film 300. At that time, the conductor film 700 embeds the groove of the silicon compound film 300. The conductor film 700 is, for example, a tungsten film, an aluminum film, or a copper film.

Figure 5E:
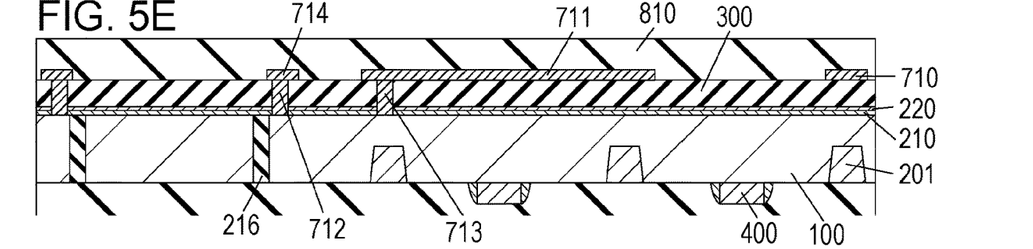

Subsequently, as shown in FIG. 5E, the conductor film 700 is patterned. The patterning is performed by photolithography and etching. A part of the conductor film 700 becomes light-shielding members 710 and 711 by the patterning, and another part becomes a guard ring 714. The light-shielding member 711 serves as a light shield for an optical black pixel and a peripheral circuit. Incidentally, at the same time as the formation of the light-shielding member 711 and the guard ring 714, a via 713 and a guard ring 712 for connecting the light-shielding member 711 and the guard ring 714 to the semiconductor layer 100 are formed in grooves of the silicon compound film 300. The guard rings 712 and 714 are disposed so as to surround the outside of the insulating region 216 in a planar view with respect to the front surface 1001.

Subsequently, as shown in FIG. 5E, an insulating material film 810 is formed. The insulating material film 810 can be arbitrarily selected from materials that are generally used in semiconductor apparatuses, such as a silicon oxide film, a silicon nitride film, a silicon oxynitride film, a carbon-containing silicon oxide film, and a fluorine-containing silicon oxide film. The layer structure of the film may be a single layer structure made of one material or a laminated layer structure made of a plurality of materials.

Figure 5F:
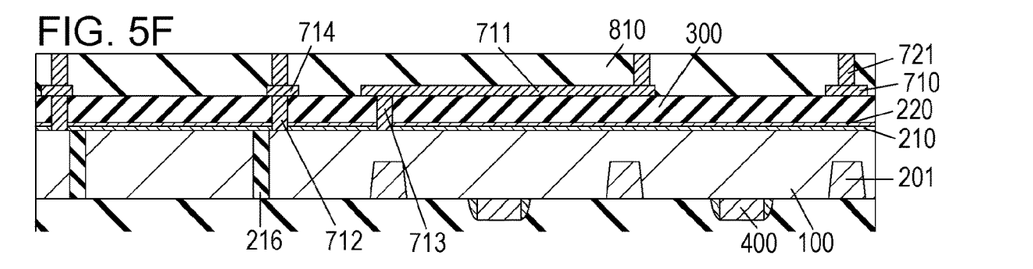

Subsequently, a groove is formed by etching from the surface of the insulating material film 810, a conductor is then formed by a PVD method or a CVD method and embeds the groove, and the conductor on the substrate surface is removed by, for example, a chemical mechanical polishing or etchback. Consequently, as shown in FIG. 5F, a light-shielding wall 721 is formed in the insulating material film 810. The number of the layers of the metal film can be arbitrarily selected.

Figure 6A:
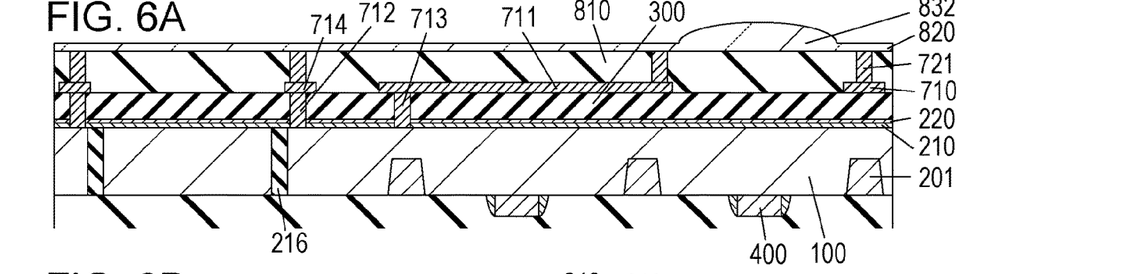
FIG. 6A to 6D are schematic cross-sectional views for explaining the method for manufacturing a photoelectric conversion apparatus.

Subsequently, a dielectric film 820 is formed on the insulating material film 810, and the dielectric film 820 is processed by, for example, photolithography and etching to form an interlayer lens 832 on the dielectric film 820 as shown in FIG. 6A. The dielectric film 820 can be arbitrarily selected from materials that are generally used in semiconductor apparatuses, such as a silicon oxide film, a silicon nitride film, a silicon oxynitride film, a carbon-containing silicon oxide film, and a fluorine-containing silicon oxide film. The layer structure of the film may be a single layer structure made of one material or a laminated layer structure made of a plurality of materials.

Figure 6B:
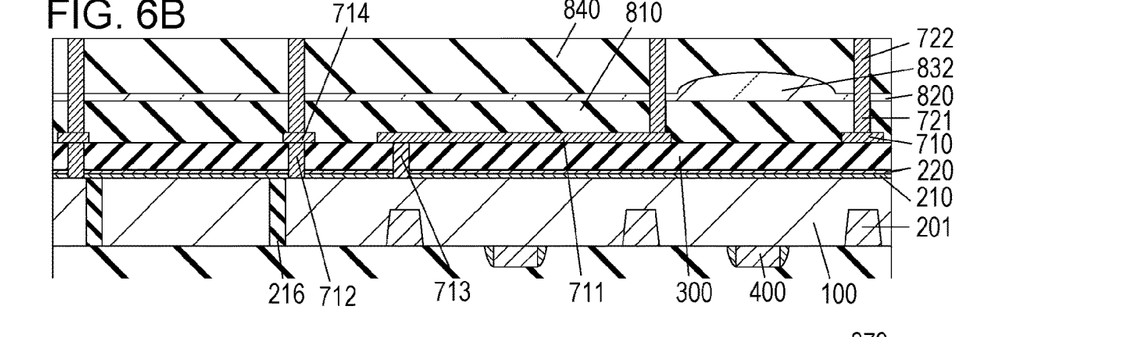

Subsequently, an insulating material film 840 is formed, a groove is formed by etching from the surface of the insulating material film 840, and the groove is then embedded with a conductor over the entire substrate surface by a PVD method or a CVD method. As shown in FIG. 6B, a light-shielding wall 722 is formed in the insulating material film 840 by removing the conductor on the substrate surface by, for example, chemical mechanical polishing or etchback. The light-shielding wall 721 and the light-shielding wall 722 are in contact with each other, and the light-shielding wall 721 and the light-shielding wall 722 function as the light-shielding wall 720 shown in FIG. 1. Insulating material film 840 can be arbitrarily selected from materials that are generally used in semiconductor apparatuses, such as a silicon oxide film, a silicon nitride film, a silicon oxynitride film, a carbon-containing silicon oxide film, and a fluorine-containing silicon oxide film. The layer structure of the film may be a single layer structure made of one material or a laminated layer structure made of a plurality of materials. The material of the light-shielding wall 722 may be, for example, tungsten.

Figure 6C:
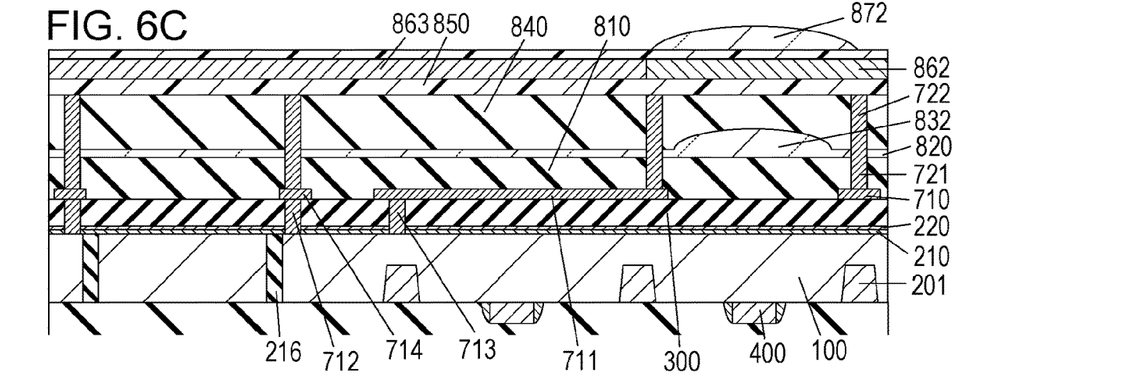

Subsequently, as shown in FIG. 6C, a planarizing film 850, color filters 862 and 863, and a microlens 872 are formed. A blue color filter 863 covers the light-shielding member 711.

The planarizing film 850 can be arbitrarily selected from materials that are generally used in semiconductor apparatuses, such as a silicon oxide film, a silicon nitride film, a silicon oxynitride film, a carbon-containing silicon oxide film, a fluorine-containing silicon oxide film, and a resin film. The layer structure of the film may be a single layer structure made of one material or a laminated layer structure made of a plurality of materials.

Figure 6D:
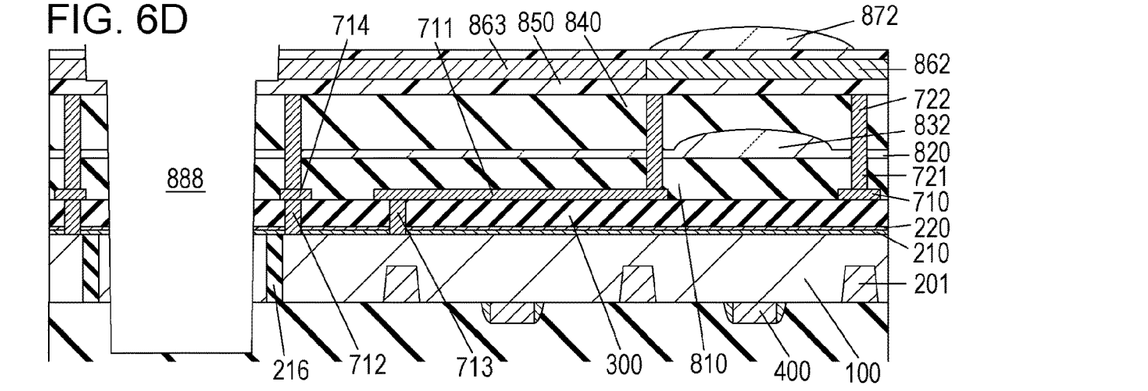

Subsequently, as shown in FIG. 6D, an aperture 888 is formed in the semiconductor layer 100 by dry etching. A pad (not shown) made of aluminum previously provided to the wiring structure 440 or the wiring structure 540 shown in FIG. 1 is exposed to the bottom of the aperture 888. A wafer including the semiconductor layer 100 is then diced into a chip, and packaging is performed to connect a wire bonding chip to the pad through the aperture 888 to obtain a photoelectric conversion apparatus.

The embodiments included in the present disclosure include not only what is described as text, but also all matters that can be read from the text and matters that can be read from the attached drawings. In the present embodiment, components can be added, deleted, or replaced without departing from the idea of the disclosure.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-007474, filed Jan. 20, 2021, which is hereby incorporated by reference herein in its entirety.

What is claimed is:

1. A photoelectric conversion apparatus comprising:
   a semiconductor layer including a plurality of photoelectric conversion portions and having a first surface and a second surface that is the surface opposite to the first surface;
   a wiring structure disposed on the second surface side of the semiconductor layer; and
   a metal compound film disposed on the first surface side of the semiconductor layer, wherein the metal compound film contains hydrogen and carbon;
   a concentration of the hydrogen in an interface on the semiconductor layer side of the metal compound film is $1\times10^{21}$ atoms/cm$^3$ or more and $1\times10^{22}$ atoms/cm$^3$ or less; and
   a concentration of the carbon in the interface on the semiconductor layer side of the metal compound film is $5\times10^{20}$ atoms/cm$^3$ or more and $1\times10^{22}$ atoms/cm$^3$ or less.

2. The photoelectric conversion apparatus according to claim 1, wherein
   the metal compound film includes at least one layer selected from the group consisting of a hafnium oxide layer, a zirconium oxide layer, an aluminum oxide layer, a titanium oxide layer, and a tantalum oxide layer.

3. The photoelectric conversion apparatus according to claim 1, wherein
   the metal compound film is a fixed electric charge film having a negative fixed electric charge.

4. The photoelectric conversion apparatus according to claim 1, wherein
   a ratio of the concentration of the hydrogen to the concentration of the carbon in the interface on the semiconductor layer side of the metal compound film is 1.5 or less.

5. The photoelectric conversion apparatus according to claim 1, wherein
   a ratio of the concentration of the hydrogen to the concentration of the carbon in the film of the metal compound film is 10 or less.

6. The photoelectric conversion apparatus according to claim 1, wherein
   a concentration of the hydrogen in the film of the metal compound film is $5\times10^{20}$ atoms/cm$^3$ or more and $2\times10^{21}$ atoms/cm$^3$ or less.

7. The photoelectric conversion apparatus according to claim 1, wherein
   a concentration of the carbon in the film of the metal compound film is $1\times10^{19}$ atoms/cm$^3$ or more and $1\times10^{21}$ atoms/cm$^3$ or less.

8. The photoelectric conversion apparatus according to claim 1, wherein
   a concentration of the carbon in the interface on the semiconductor layer side of the metal compound film is $2\times10^{21}$ atoms/cm$^3$ or more and $1\times10^{22}$ atoms/cm$^3$ or less.

9. The photoelectric conversion apparatus according to claim 1, wherein
   the metal compound film is a multilayer film including a first metal compound layer and a second metal compound layer; and
   a distance between the first metal compound layer and the semiconductor layer is smaller than a distance between the second metal compound layer and the semiconductor layer.

10. The photoelectric conversion apparatus according to claim 9, wherein
    the first metal compound layer is the layer nearest the semiconductor layer among a plurality of layers constituting the metal compound film;
    a concentration of the hydrogen in an interface on the semiconductor layer side of the first metal compound layer is $1\times10^{21}$ atoms/cm$^3$ or more and $1\times10^{22}$ atoms/cm$^3$ or less; and
    a concentration of the carbon in the interface on the semiconductor layer side of the first metal compound layer is $2\times10^{21}$ atoms/cm$^3$ or more and $1\times10^{22}$ atoms/cm$^3$ or less.

11. The photoelectric conversion apparatus according to claim 9, wherein
    the first metal compound layer is any of a hafnium oxide layer, a zirconium oxide layer, an aluminum oxide layer, a titanium oxide layer, and a tantalum oxide layer.

12. The photoelectric conversion apparatus according to claim 9, wherein
    the first metal compound layer is an aluminum oxide layer.

13. The photoelectric conversion apparatus according to claim 9, wherein
    the second metal compound layer is any of a hafnium oxide layer, a zirconium oxide layer, an aluminum oxide layer, a titanium oxide layer, and a tantalum oxide layer.

14. The photoelectric conversion apparatus according to claim 9, wherein the second metal compound layer is a hafnium oxide layer or a tantalum oxide layer.

15. The photoelectric conversion apparatus according to claim 1, further comprising an insulation layer between the semiconductor layer and the metal compound film, wherein
an interface on the semiconductor layer side of the metal compound film is the interface between the metal compound film and the insulation layer.

16. The photoelectric conversion apparatus according to claim 15, wherein
the insulation layer has a thickness of 0.1 nm or more and 10 nm or less.

17. The photoelectric conversion apparatus according to claim 15, wherein
the insulation layer is a silicon oxide layer.

18. A photoelectric conversion apparatus comprising:
a semiconductor layer including a plurality of photoelectric conversion portions and having a first surface and a second surface that is the surface opposite to the first surface;
a wiring structure disposed on the second surface side of the semiconductor layer; and
a metal compound film disposed on the first surface side of the semiconductor layer, wherein
the metal compound film is a multilayer film including a first metal compound layer and a second metal compound layer;
a distance between the first metal compound layer and the semiconductor layer is smaller than a distance between the second metal compound layer and the semiconductor layer;
the first metal compound layer is a layer nearest the semiconductor layer among a plurality of layers constituting the metal compound film;
the first metal compound layer contains hydrogen and carbon;
a concentration of the hydrogen in an interface on the semiconductor layer side of the first metal compound layer is $1\times10^{21}$ atoms/cm$^3$ or more and $1\times10^{22}$ atoms/cm$^3$ or less; and
a concentration of the carbon in the interface on the semiconductor layer side of the first metal compound layer is $5\times10^{20}$ atoms/cm$^3$ or more and $1\times10^{22}$ atoms/cm$^3$ or less.

19. The photoelectric conversion apparatus according to claim 18, wherein
a concentration of the carbon in the interface on the semiconductor layer side of the first metal compound layer is $2\times10^{21}$ atoms/cm$^3$ or more and $1\times10^{22}$ atoms/cm$^3$ or less.

20. Equipment comprising:
a photoelectric conversion apparatus; and
at least one of followings:
an optical system associated with the photoelectric conversion apparatus;
a controller for controlling the photoelectric conversion apparatus;
a processor for processing a signal output from the photoelectric conversion apparatus;
a display for displaying information obtained by the photoelectric conversion apparatus;
a memory for storing information obtained by the photoelectric conversion apparatus; and
a mechanical device for moving the photoelectric conversion apparatus based on information obtained by the photoelectric conversion apparatus,
wherein the photoelectric conversion apparatus comprises:
a semiconductor layer including a plurality of photoelectric conversion portions and having a first surface and a second surface that is the surface opposite to the first surface;
a wiring structure disposed on the second surface side of the semiconductor layer; and
a metal compound film disposed on the first surface side of the semiconductor layer, wherein
the metal compound film contains hydrogen and carbon;
a concentration of the hydrogen in an interface on the semiconductor layer side of the metal compound film is $1\times10^{21}$ atoms/cm$^3$ or more and $1\times10^{22}$ atoms/cm$^3$ or less; and
a concentration of the carbon in the interface on the semiconductor layer side of the metal compound film is $5\times10^{20}$ atoms/cm$^3$ or more and $1\times10^{22}$ atoms/cm$^3$ or less.

* * * * *